United States Patent
Newsome et al.

(10) Patent No.: US 7,658,465 B2
(45) Date of Patent: Feb. 9, 2010

(54) INKJET DEPOSITION APPARATUS

(75) Inventors: Christopher Newsome, Cambridge (GB); Takeo Kawase, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1054 days.

(21) Appl. No.: 10/475,291

(22) PCT Filed: Sep. 9, 2002

(86) PCT No.: PCT/GB02/04071

§ 371 (c)(1),
(2), (4) Date: Apr. 22, 2004

(87) PCT Pub. No.: WO03/022590

PCT Pub. Date: Mar. 20, 2003

(65) Prior Publication Data

US 2004/0169691 A1    Sep. 2, 2004

(30) Foreign Application Priority Data

Sep. 10, 2001    (GB) .................................. 0121814.8

(51) Int. Cl.
*B41J 2/155*    (2006.01)
(52) U.S. Cl. .............................. 347/42; 427/58; 347/57; 347/14; 347/10; 347/11; 347/5; 347/8
(58) Field of Classification Search .................. 427/58; 347/42
See application file for complete search history.

(56) References Cited

U.S. PATENT DOCUMENTS

| 4,445,128 | A | * | 4/1984 | Dolan et al. | ................. | 347/130 |
| 5,997,119 | A |   | 12/1999 | Kerr |   |   |
| 6,170,933 | B1 | * | 1/2001 | Nitta et al. | ..................... | 347/42 |
| 6,416,149 | B2 | * | 7/2002 | Takahashi | ..................... | 347/10 |
| 6,471,319 | B1 | * | 10/2002 | Adkins et al. | ................. | 347/11 |

FOREIGN PATENT DOCUMENTS

| EP | 0 902 315 A2 |   | 3/1999 |
| EP | 0902315 | * | 3/1999 |
| EP | 0 976 567 A2 |   | 2/2000 |
| EP | 0976567 | * | 2/2000 |
| JP | A-08-206561 |   | 8/1996 |
| JP | A-09-080218 |   | 3/1997 |
| JP | A 2000-43249 |   | 2/2000 |
| JP | A 2000-251666 |   | 9/2000 |
| JP | A 2001-058408 |   | 3/2001 |

* cited by examiner

*Primary Examiner*—Shamim Ahmed
*Assistant Examiner*—Maki Angadi
(74) *Attorney, Agent, or Firm*—Oliff & Berridge

(57) ABSTRACT

An inkjet deposition apparatus includes a position encoder 128 in a translation stage 116. The position encoder provides encoder signals which are used as a clock signal for a pattern memory 136. Ejection of droplets of a material to be printed can therefore be synchronised with the speed of movement of the translation, providing improved accuracy and speed of deposition.

7 Claims, 5 Drawing Sheets

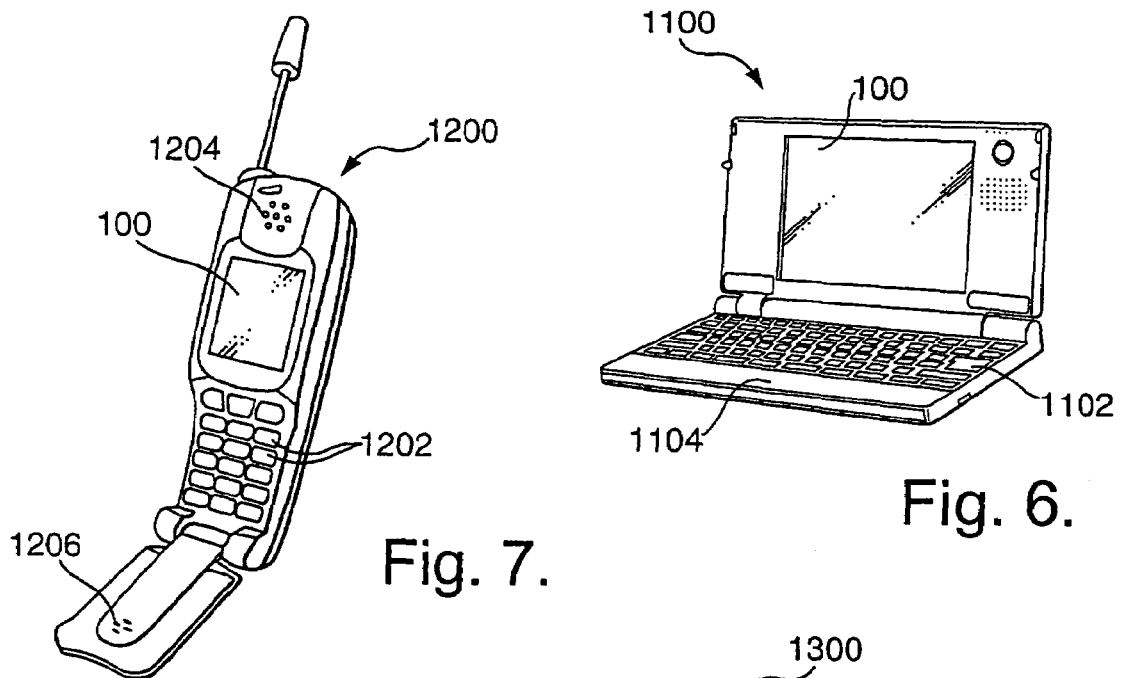
Fig. 6.
Fig. 7.
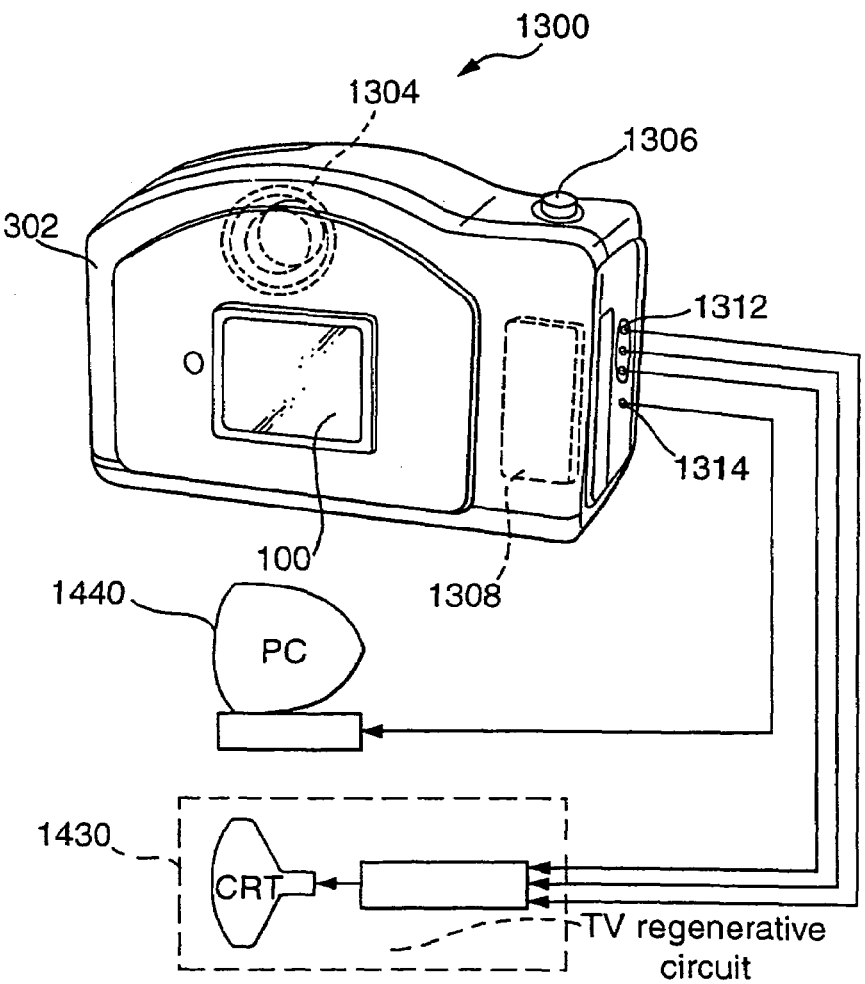
Fig. 8.

INKJET DEPOSITION APPARATUS

The present invention relates to the deposition of soluble materials and in particular to the deposition of soluble materials using inkjet technology.

In recent years there has been an increase in the number of products which require, as part of their fabrication process, the deposition of organic or inorganic soluble or dispersible materials such as polymers, dyes, colloid materials and the like on solid surfaces. One example of these products is an organic polymer electroluminescent display device. An organic polymer electroluminescent display device requires the deposition of soluble polymers into predefined patterns on a solid substrate in order to provide the light emitting pixels of the display device. Further examples include the deposition of materials for forming organic polymer thin film transistors (TFTs) on a substrate and interconnects between chips assembled on the substrate using fluidic self assembly (FSA). The substrate may, for example, be formed of glass, plastics or silicon.

Typically, the substrate is a rigid substrate, thereby providing a rigid display device. However, products comprising flexible displays, which may be rolled or folded, are increasingly sought after, in particular where a large display is required. Such flexible displays provide substantially improved weight and handling characteristics and are less likely to fail due to shock during installation of the display device or use of the display device. In addition, relatively small display devices comprising a large display area may be conveniently provided.

In the manufacture of semiconductor display devices, including light emitting diode (LED) displays, it has been conventional to use photolithographic techniques. However, photolithographic techniques are relatively complex, time consuming and costly to implement. In addition, photolithographic techniques are not readily suitable for use in the fabrication of display devices incorporating soluble organic polymer materials. Concerns relating to the fabrication of the organic polymer pixels have, to some extent, hindered the development of products such as electroluminescent display devices incorporating such materials to act as the light emitting pixel elements.

The use of etch masks, such as photo masks for photolithography or metal shadow masks for patterning by evaporation deposition, is well known in conventional fabrication techniques. Hence, these processes will not be described in detail in the context of the present invention. However, such conventional fabrication techniques present severe process concerns for a number of practical applications including large scale display devices. Indeed, the etching and deposition of relatively long but extremely narrow lines has, for a long period of time, presented severe fabrication difficulties as it is very difficult to produce mechanically robust masks which will provide the required definition in the finished product. For example, a metal shadow mask for evaporation deposition for a large scale display device will inevitably exhibit some sagging or bowing in the central unsupported portion of the mask. This leads to an uneven distance between the mask and the substrate at the edge and the centre of the substrate respectively, thereby giving rise to uneven width and thickness of the deposited lines which can adversely affect the quality of the displayed image.

Consequently, it has been proposed to use inkjet technology to deposit the soluble organic polymers in the fabrication of, for example, electroluminescent display devices. Inkjet technology is, by definition, ideally suited to the deposition of such soluble or dispersible materials. It is a fast and inexpensive technique. In contrast to alternative techniques such as spin coating or vapour deposition, it instantly provides patterning without the need for an etch step in combination with a lithographic technique. However, the deposition of the soluble organic materials onto the solid surface using inkjet technology differs from the conventional use of the technology, to deposit ink on paper, and a number of difficulties are encountered. In particular, there is a primary requirement in a display device for uniformity of light output and uniformity of electrical characteristics. There are also spatial limitations imposed in device fabrication. As such, there is the non-trivial problem to provide very accurate deposition of the soluble polymers onto the substrate from the ink-jet print head. This is particularly so for colour displays as respective polymers providing red, green and blue light emissions are required to be deposited at each pixel of the display.

To assist the deposition of the soluble materials it has been proposed to provide the substrate with a layer which includes a pattern of wall structures defined in a de-wetting material so as to provide an array of wells or elongate trenches, bounded by the wall structures, for receiving the material to be deposited. Such a patterned substrate will be referred to hereinafter as a bank structure. When organic polymers in solution are deposited into the wells, the difference in the wettability of the organic polymer solutions and the bank structure material causes the solution to self align into the wells provided on the substrate surface.

However, it is still necessary to deposit the droplets of organic polymer material in substantial alignment with the wells in the bank structure. Even when such a bank structure is used, the deposited organic polymer solution adheres to some extent to the walls of the material defining the wells. This causes the central area of each deposited droplet to have, at best, a thin coating of deposited material, perhaps as low as 10% of the material in comparison to the material deposited at the walls of the bank structure. The deposited polymer material at the centre of the wells acts as the active light emissive material in the display device. If the polymer material is not deposited in accurate alignment with the wells, the material will be distributed unevenly, and therefore the amount and thickness of the active light emissive material can be further reduced. This thinning of the active light emissive material is of serious concern because the current passing through the material in use of the display is increased which reduces the life expectancy and the efficiency of the light emissive devices of the display. This thinning of the deposited polymer material will also vary from pixel to pixel if deposition alignment is not accurately controlled. This gives rise to a variation in the light emission performance of the organic polymer material from pixel to pixel because the LEDs constituted by the organic material are current driven devices and, as stated above, the current passing through the deposited polymer material will increase with any decrease in the thickness of the deposited material.

This performance variation from pixel to pixel gives rise to non-uniformity in the displayed image, which degrades the quality of the displayed image. This degradation of image quality is in addition to the reduction in operating efficiency and working life expectancy of the LEDs of the display. It can be seen therefore that accurate deposition of the polymer materials is essential to provide good image quality and a display device of acceptable efficiency and durability, irrespective of whether a bank structure is provided.

There are two main types of inkjet head. One type uses a thermal print head and these are commonly known as bubble jet heads. The second type uses a piezoelectric print head where a piezoelectric device is located behind a diaphragm in communication with a reservoir. In this second type of inkjet head the piezoelectric device is energised and the diaphragm deflects to pressurise the reservoir, forcing the liquid contained in the reservoir, in this case the polymer material in solution to provide the light emissive pixels for a display, out through a nozzle as a fine droplet of the polymer material. With either type of print head, the nozzle has a very small outlet orifice, typically of a diameter of about 30 microns. The organic polymers are usually dissolved in a relatively volatile organic solvent so that they can be deposited in solution.

During deposition, the inkjet print head is maintained as close as possible to the substrate. Usually, the inkjet print head is arranged at a separation of about 0.5 mm to 1.0 mm above the substrate. However, in inkjet printing the droplets have a flight speed typically in the range of 2 to 10 $ms^{-1}$. The relative speed between the substrate and print head is typically in the range of 0.1 to 1 $ms^{-1}$. Assuming a droplet speed of about 5 $ms^{-1}$ and a separation of 1 mm between the inkjet head and substrate, the time taken for an ejected droplet to reach the substrate is about 0.2 milliseconds. If the print head has a transverse speed of 0.1 $ms^{-1}$ relative to the deposition substrate, an offset of 20 μm will be created between the ejection point and the actual deposition point on the substrate. This offset is regular and equal for all nozzles of the inkjet print head. For conventional printing, in which case the substrate is paper, which is the normal use of this technology, this offset is not problematical because it is the same over the entire printed image and such a small offset in the position of the printed image on the paper is not discernible to a person viewing the printed image.

However, it will be appreciated that offsets of the order 20 μm are significant when printing electronic, opto-electronic or optical devices such as colour filters on a substrate. For example, where an organic polymer TFT is to be printed on the substrate it is desirable to maintain a channel length between the source and drain as small as possible, and preferably less than 20 μm. Similarly, in a colour electroluminescent device, it is necessary to provide a droplet of each of three different organic materials, as well as to deposit electrodes for each droplet, within one pixel area. Hence, to improve the accuracy of deposition for printing electronic devices, a 'step and drop' technique, as described in more detail below, is usually adopted.

FIG. 1 shows a conventional inkjet deposition machine 100 for a rigid substrate comprising a base 102 supporting a pair of upright columns 104. The columns 104 support a transverse beam 106 upon which is mounted a carrier 108 supporting an inkjet print head 110. The base 102 also supports a platen 112 upon which may be mounted a substrate 114, which is typically glass and currently has a typical maximum size of 40 cm×50 cm. The platen 112 is mounted from the base 102 via a computer controlled motorised translation stage for effecting movement of the platen 112 both in a transverse and a longitudinal direction relative to the inkjet print head, as shown by the axes X and Y in FIG. 1. As the movement of the platen 112, and hence the substrate 114 relative to the inkjet head 110 is under computer control, arbitrary patterns may be printed onto the substrate by ejecting appropriate materials from the inkjet head 110. The computer control is further used to control the selection and driving of the nozzles and a camera may be used to view the substrate during printing.

Movement of the platen 112, especially if the platen is for a large substrate, gives rise to considerable momentum and thereby necessitates the provision of a large and usually massive support or base 102. The considerable momentum of the platen 112 exacerbates the problem of backlash. Backlash, which is known and problematic even in conventional printing on paper, is caused by reversing the direction of the translation stage 116. This reversal of direction causes an erroneous position of the print head relative to the substrate. Generally, the faster the reversal of direction, the greater the error. Accordingly, in order to calculate the correct relative position of the translation stage relative to the print head, it is usually necessary for the control system to read encoding marks for the translation mechanism after the direction of printing has been reversed but before printing recommences.

However, even if encoding marks for the translation mechanism are read after the direction of printing has been reversed, subsequently deposited droplets with the translation stage moving in the reverse direction will not be aligned with droplets deposited while the translation stage is moved in the forward direction. This is because the control system calculates the position of the translation mechanism with respect to a reference point different to that used for the forward direction.

To avoid this problem of asymmetric deposition, droplets may be deposited when the translation mechanism is moved in one direction only, so that the control system calculates the position of the translation mechanism with respect to a single reference point. However, depositing droplets in a single direction considerably lowers the deposition speed and hence significantly increases the time required to fabricate the devices.

It has been proposed to provide a mechanism for translating the print head 110 along the beam 106 disposed horizontally over the stationary substrate 114. However, the beam 106, being a physical structure, bends very slightly under gravitational forces. Thus, the centre part of the beam 106 will substantially maintain its horizontal disposition so that a droplet deposited with the print head 110 positioned over a central location of the substrate 114 will maintain a flight path perpendicular to the substrate 114. However, as the print head 110 is translated away from this central part of the beam 106, it will no longer be supported truly horizontally over the substrate 114 so the flight path at this second position will no longer be perpendicular to the substrate 114. Hence, if the print head is moved by X cm along the beam 106, this can give rise to a variation in deposition point of X+α at the substrate 114, where α is the additional variable offset caused by the slight bending of the beam 106. Of course, offset α increases as X increases.

FIG. 2 illustrates the operation of the inkjet machine shown in FIG. 1.

The inkjet machine 100 is controlled from a computer 118, where the pattern and printing coordinates of the device to be printed in the substrate 114 are defined. A command to move the translation stage 116 is sent from the computer 118 to a motion controller 120. When the translation stage reaches a certain position, the motion controller 120 sends a 'ready' signal to the computer 118 and a trigger pulse is then sent by the computer to a waveform generator 122. This waveform generator provides drive signals which are used to drive inkjet print head 110 via a power amplifier 124. When printing a device with the machine 100, the translation stage is normally programmed to move to a required position, and when this position is reached, the translation stage stops and the inkjet head 110 is programmed to print one, or a number of drops of a material to be used to print the pattern. The translation stage is then moved to another coordinate under program control, and then one or a number of drops are again ejected from the print head. The printing time using this 'step and drop' technique is relatively long because the majority of the fabrication time is consumed by waiting for the translation stage to stop.

To be able to print a continuous line for example, it is possible for the frequency of the drive signals which are output from the waveform generator 122 to be set independently of the motion of the translation stage 116 but in all cases, the computer controls the operation of the inkjet head independently of the control of the motorised translation stage.

However, the space between each droplet in the printed line is determined by both the frequency of the pulses of the driving waveform and the velocity of the translation stage. Therefore, extremely accurate matching of these two parameters is required in order to achieve accurate printing and this is extremely difficult to achieve in practice. It is more usual in the printing of electronic devices to arrange for the translation mechanism to move the substrate relative to the print head but because there is no correlation between the actual position of the translation stage and the timing of droplet ejection, printing errors which are unsatifactory for device fabrication continue to occur.

The distinction between a standard inkjet printer used for printing documents and an inkjet machine for printing electronic devices is that in the case of printing a document, there may be an error in the absolute position of the droplets, but since the space between each droplet is relative, the printed image will appear correct to the eye of a viewer whereas, for an electronic device, the absolute position of the printing must be maintained throughout the whole area of printing of the device in order to obtain devices of the required performance and quality.

For the current inkjet machine as outlined above, the translation stage 116 comprises a stepping motor stage. Such a stage has a lead screw which rotates according to the frequency and number of command pulses it receives from the motion controller. This lead screw usually has some errors; i.e. it may for example have a periodic fluctuation in the screw pitch, which can give rise to a periodic error in the translation distance, which in turn gives rise to errors in the patterning of the device. The position of the stage is not continuously monitored as it moves; the position is set by coordinates received by the motion controller 120 from the computer 118 and it is assumed that the actual position reached by the translation stage 116 will be the position as instructed by the stored coordinates. It is also expected that the translation stage will have reached a stationary condition at the required coordinates when the droplet or droplets are ejected from the inkjet head 110. However, because of the positional errors in the translation stage, printing may be made when the stage is still in motion. If either of the above conditions occur, no matter how precisely the output signals of the waveform generator are matched to the velocity or stored position of the translation stage, there will be an error in the position of the printing. The only way an error can be compensated is by moving the translation stage by small amounts to the correct position, and effecting printing statically at the corrected position. This process can be particularly burdensome as the corrected position needs to be determined by viewing the device being printed with a microscope which must be incorporated into the inkjet machine. This is particularly burdensome and leads to a significant increase in the cost of fabricating devices.

The time required to fabricate certain electronic devices, such as organic LED displays, can be a crucial factor in the resulting display quality exhibited by the display. One reason for this is that the organic polymer materials can degrade if exposed for too long to the ordinary atmosphere during fabrication. Hence, an inkjet machine which is able to not only improve the accuracy of material deposition but is also able to achieve such improved deposition in a shorter fabrication time is highly desirable and particularly advantageous.

The present invention seeks to provide therefore an improved form of inkjet machine in which both the accuracy and speed of printing of the materials to be deposited are enhanced in comparison to the known forms of inkjet machine.

According to a first aspect of the present invention there is provided an inkjet machine comprising means for providing drive signals to an inkjet print head, the drive signals being arranged to cause ejection of one or more droplets of material to be printed from a nozzle of the inkjet print head, a translation stage for providing relative movement between a substrate to be printed with the material and the inkjet print head, a monitoring unit for monitoring the position of the translation stage and control means for controlling the provision of the drive signals in dependence upon the monitored position of the translation stage.

Preferably, the translation stage is arranged to move the substrate relative to the inkjet print head.

In a preferred embodiment, the monitoring unit comprises a position encoder, which may comprise an optical encoder, for providing an encoder signal having a frequency dependent upon the speed of movement of the translation stage.

The encoder signal may be arranged to control the timing of the provision of the drive signals to the inkjet print head during translation of the substrate relative to the head corresponding to a spatial resolution in the range of from about 0.1 to about 10 microns between two successive droplets deposited from the inkjet head.

Advantageously, the timing of the provision the drive signals corresponds to a movement of 0.2 microns of the translation stage.

The inkjet machine may also be provided with a clock source for controlling the provision of the drive signals from the waveform generator when there is no movement of the translation stage and the inkjet print head is positioned outside of an area to be printed on the substrate.

By using a translation stage with a feedback system, the position of the stage is continuously monitored, and the timing of the drive signals from the waveform generator is automatically controlled by the translation speed of the translation stage. The result of using such a system with position registration is that the timing of the ejection of the material being printed is determined by the actual position of the stage, and not by a time based calculation which is based upon an assumed position for the translation stage, as in the case for current inkjet machines. Also, any errors in the manufacturing tolerances of the lead screw of the translation stage can be compensated for, because the system continuously corrects for any unpredictable fluctuations in the velocity at which the translation stage is moved.

According to a second aspect of the present invention there is provided a method of inkjet printing comprising monitoring the position of a translation stage for providing relative movement between a substrate to be printed and an inkjet print head, and controlling the provision of drive signals arranged to cause ejection of one or more droplets of material from a nozzle of the inkjet print head in dependence upon the monitored position of the translation stage.

In a preferred method, the translation stage is arranged to provide movement of the substrate relative to the inkjet print head.

The method may comprise generating an encoder signal having a frequency dependent upon the speed of movement of the translation stage and using the encoder signal to control the provision of the drive signals.

An optical encoder may, advantageously, be used to generate the encoder signal.

In a preferred form of the method, the encoder signal is arranged to control the timing of the provision of the drive signals to the inkjet print head such that the translation stage provides relative movement between the substrate and the inkjet print head of from about 0.1 to about 10 microns between ejection of two successive droplets from the inkjet head.

Preferably, the timing of the provision of the drive signals provides about 0.2 microns of spatial resolution between two successive droplets deposited from the inkjet head.

The method of the present invention may also comprise selecting a clock signal from a clock source for controlling the provision of the drive signals to the inkjet print head when there is no movement of the translation stage and the inkjet print head is positioned outside of an area to be printed on the substrate.

According to a third aspect of the present invention there is provided an electronic, opto-electronic, optical or sensor device manufactured using an inkjet machine according to the first aspect or a method of inkjet printing according to the second aspect.

Embodiments of the present invention will now be described by way of further example only and with reference to the accompanying drawings, in which:

FIG. 6 is a schematic view of a mobile personal computer incorporating a display device fabricated by apparatus in accordance with the present invention;

FIG. 7 is a schematic view of a mobile telephone incorporating a display device fabricated by apparatus in accordance with the present invention; and FIG. 8 is a schematic view of a digital camera incorporating a display device fabricated by apparatus in accordance with the present invention.

Figure 1:
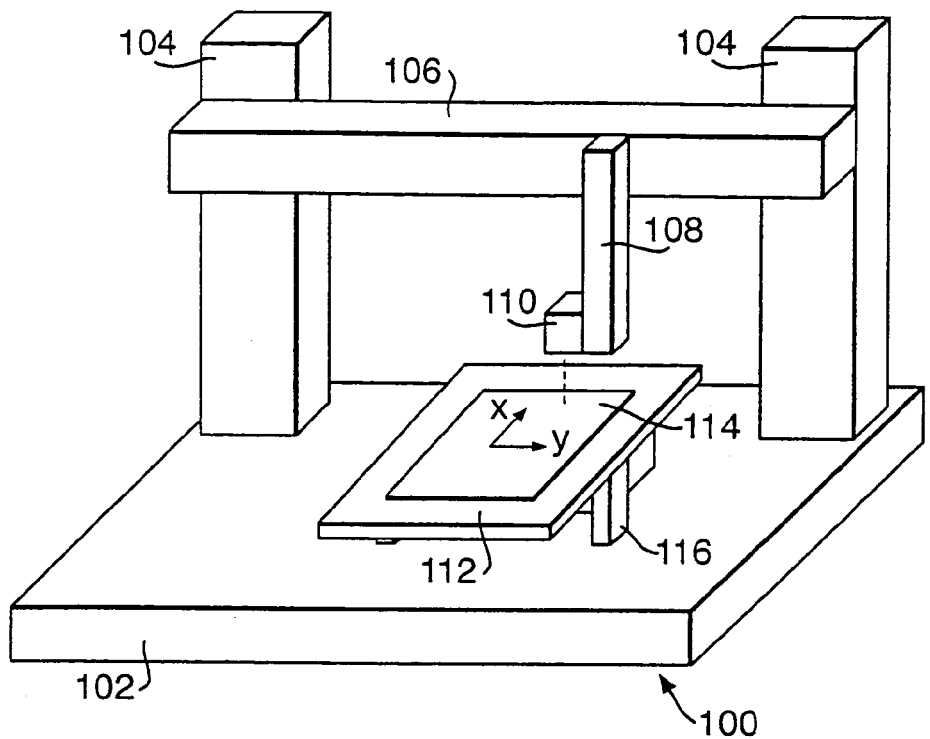
FIG. 1 is a schematic representation of a prior art inkjet deposition apparatus.
Figure 2:
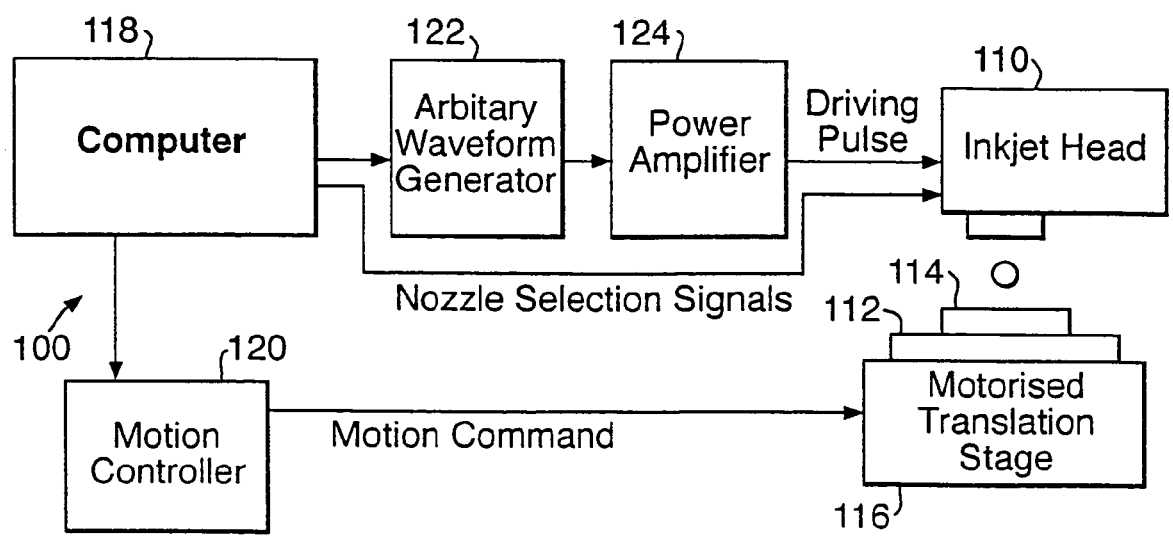
FIG. 2 is a schematic block diagram of the control system for controlling the operation of the inkjet head and the motion of the translation stage for the inkjet deposition apparatus shown in FIG. 1.

Referring to FIG. 2, which shows a known form of inkjet deposition apparatus, the computer 118 defines the pattern and printing coordinates of the device to be printed on the substrate 114 by the inkjet head 110. The inkjet head 110 includes a matrix array of nozzles (not shown), each for ejecting the droplets of the material to be printed. The pattern information stored in the computer 118 is used to generate nozzle selection signals which are fed to the inkjet head 110. These nozzle selection signals determine which of the nozzles of the array of nozzles are to be used to eject the material for printing at any part of the pattern for the device being printed. The computer 118, from the pattern and printing coordinates, controls the motion controller 120 which outputs motion command signals which cause the motorised translation stage to take up a desired position under the inkjet print head.

However, it can be clearly seen from FIG. 2 that there is no feedback from the translation stage to the other parts of the system so the system operation is based on the assumption that the motorised translation stage can move at a predefined velocity and to a predefined positional accuracy to ensure that, when the driving pulses from the waveform generator 122 are received by the inkjet head, the ejected droplets from the nozzles selected by the nozzle selection signals are deposited at the desired coordinates on the substrate 14.

Figure 3:
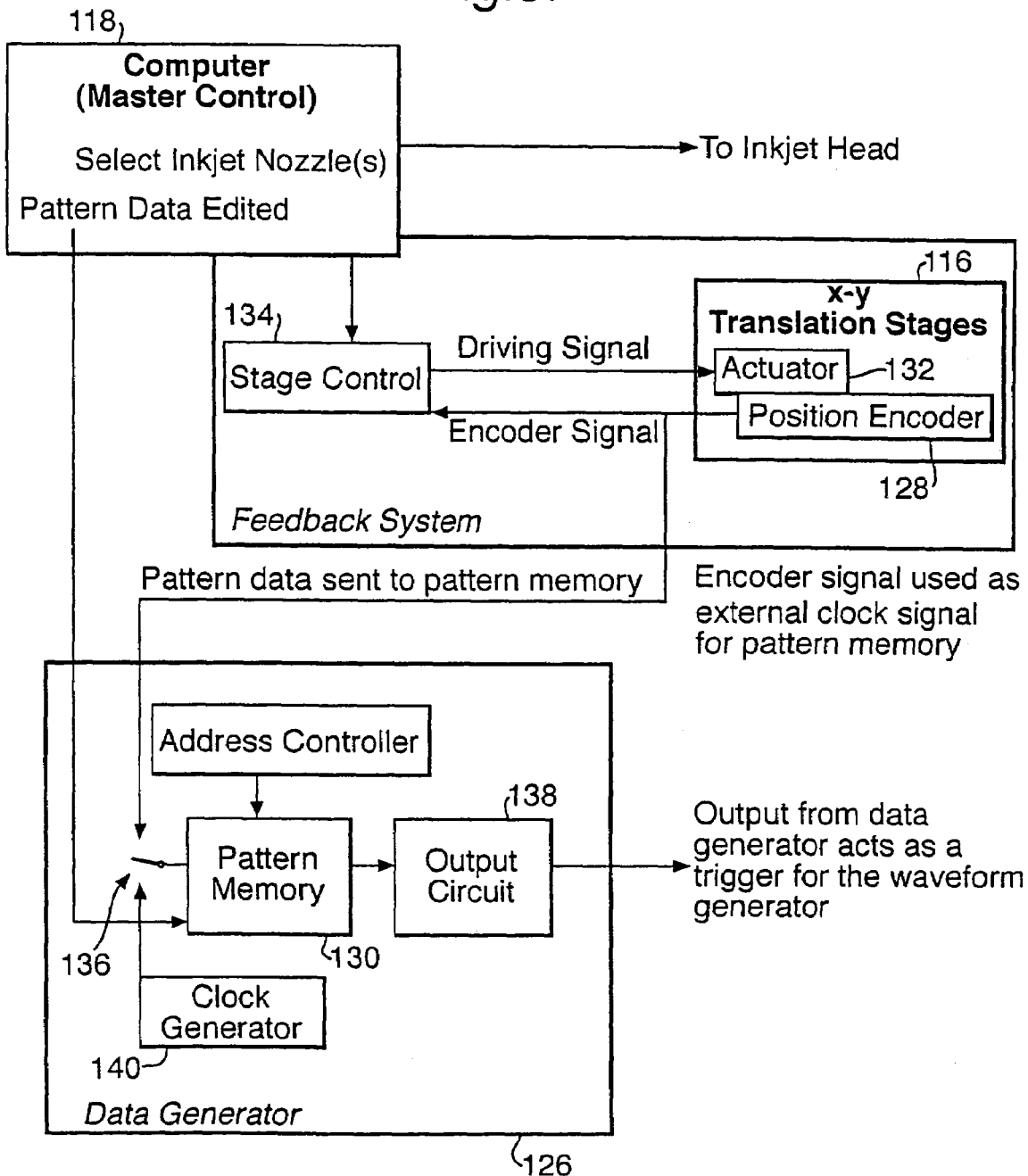
FIG. 3 is a schematic block diagram of a control system of an inkjet deposition apparatus according to the present invention.

FIG. 3 shows the control system for an inkjet deposition machine of the present invention and like reference numerals are used in FIG. 3 to describe like parts of the system shown in FIG. 2. A computer 118 provides master control of the system and, as with the system shown in FIG. 2, nozzle selection signals are provided to the inkjet head to select those nozzles from which ejection of the material for printing is to occur. The inkjet deposition apparatus also includes a waveform generator (not shown in FIG. 3) for supplying the driving pulses to the inkjet head. In the above respects therefore the inkjet deposition apparatus is similar to the apparatus shown in FIG. 2.

A principal difference with the inkjet apparatus of the present invention is that the waveform generator is driven by a data generator 126 instead of being driven directly from the computer 118. The data generator 126 is arranged to receive an encoder signal from a position encoder 128 which is incorporated into the motorised translation stage 116. The encoder signal from the position encoder 128 is used as an external clock signal for a pattern memory 130 of the data generator 126. Hence, the inkjet apparatus provides synchronisation between the motion of the translation stage 116 and the pattern data held in the pattern memory. The timing at which the inkjet head is driven by the driving pulses from the waveform generator is therefore determined by the velocity and actual sensed position of the translation stage 116.

As with the inkjet apparatus shown in FIG. 2, the computer 118 is programmed with the pattern data of the device to be printed. In operation of the apparatus, the pattern data is sent by the computer 118 to the data generator 126, where it is stored in the pattern memory 130. The nozzles to be used for printing of the pattern are then selected by the provision by the computer 118 of the nozzle selection signals to the inkjet head. The computer 118 also provides a motion command or driving signal to an actuator 132 in the translation stage 116 via a stage control circuit 134 which causes the translation stage to move to the desired coordinates in relation to the nozzles of the inkjet head as required by the pattern data. Preferably, the actuator 32 comprises a DC servomotor, which may be a linear or rotary type motor.

The translation stage, however, includes the position encoder 128, which may for example be an optical or a magnetic encoder, that provides an encoder signal which is fed to the stage control circuit 134 and the data generator 126. By using the encoder signal in a feedback system to the stage control circuit, the driving signal fed to the translation stage can be controlled to ensure that the translation stage 116 is moved relative to the print head with the required velocity and to the required coordinates. Hence, the system is able to compensate for any periodic fluctuations which may be present in the lead screw or other parts of the actuator used to effect motion to the translation stage 116.

The encoder signal is also fed to the data generator 126 via a switch 136 where it acts as a clock signal for the pattern memory 130. In this manner, the output signal from the data generator 126, which acts as a trigger signal for the waveform generator, is synchronised with the actual motion of the translation stage 116. Hence, the provision of the drive signals from the waveform generator, which cause the ejection of droplets of the material to be printed from the nozzles of the inkjet head, are controlled in dependence upon the position of the translation stage 116.

The translation stage is programmed by the computer 118 with position coordinates for the pattern, required acceleration and velocity of movement and the data generator 126 is actually clocked when the translation stage moves through the provision of the encoder signal from the position encoder 128. Thus, printing of the electronic device on the substrate can be made at any time, including when the translation stage 116 is accelerating, decelerating or moving at constant speed, thereby decreasing significantly the time required to fabricate the electronic device on the substrate.

Furthermore, because the pattern memory 130 is synchronised with the movement of the translation stage 116, extremely accurate printing of the required pattern can be achieved since the ejection of the material for printing from the inkjet head is controlled by the actual position of the translation stage 116, as sensed by the position encoder 128, and not by a time based system as in the independent waveform triggering of the prior art system shown in FIG. 2. Preferably, the position encoder 128 provides encoder signals having a frequency such that the pattern memory 130 is clocked with a cycle corresponding to from about 0.1 to about 10 microns of travel of the translation stage 116. For the printing of most devices a cycle corresponding to 0.2 microns of travel of the translation stage has been found to be particularly beneficial.

Figure 4:
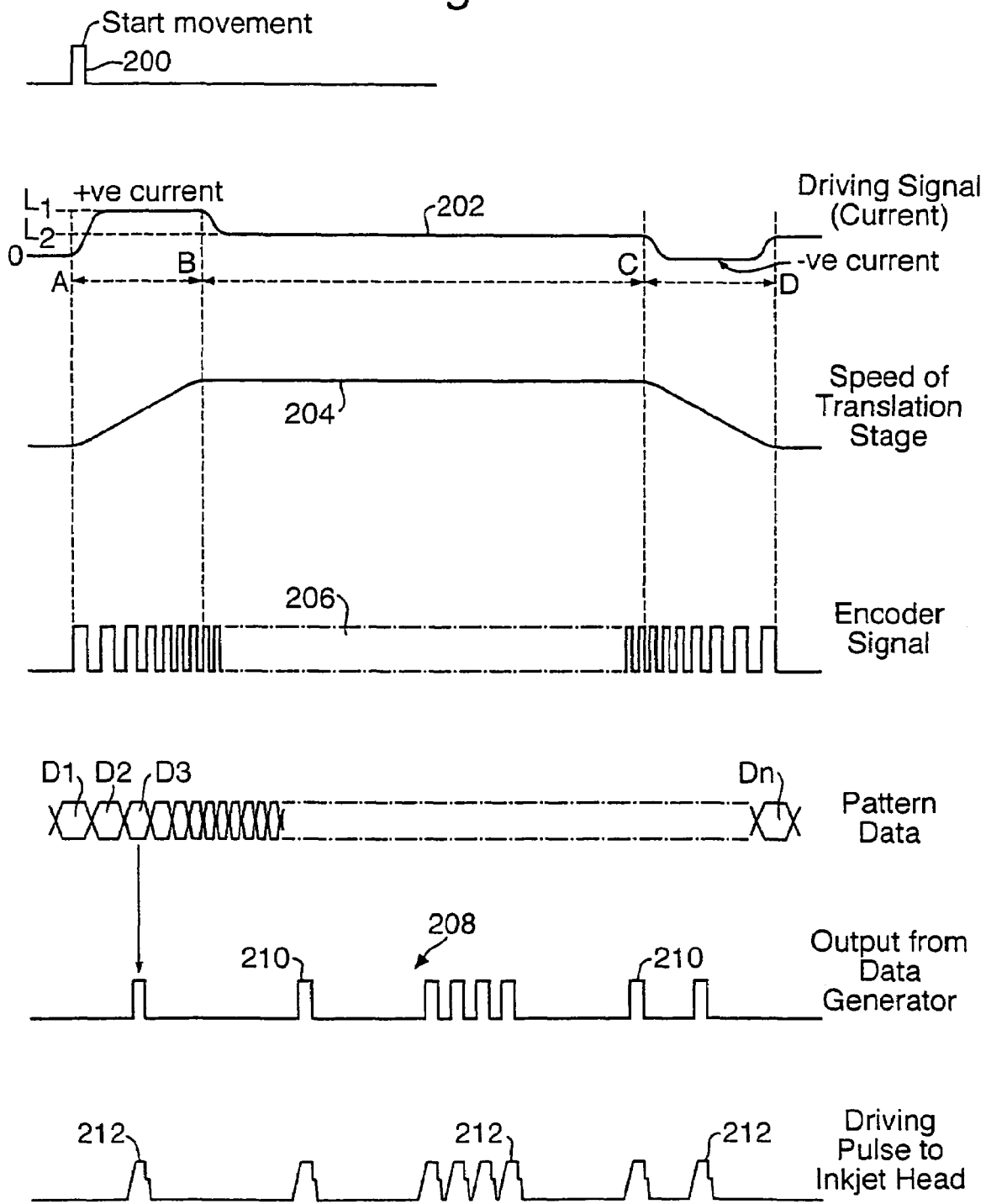
FIG. 4 shows waveform diagrams for the control system illustrated in FIG. 3.

The signal timing for operation of the inkjet apparatus can be seen in FIG. 4.

Movement of the translation stage 116 is started by the provision by the computer 118 of a start movement trigger pulse 200 to the stage control 134. Upon receipt of the pulse 200 the stage control 134 provides a current based driving signal 202 to the actuator 132 of the translation stage 116. The driving signal 202 is arranged to ramp up quickly from zero to a level $L_1$ and the level $L_1$ is held for a short period of time so as to provide rapid acceleration of the translation stage 116. The driving signal 202 is then reduced from level $L_1$ to a reduced level, shown as level $L_2$ in FIG. 4, to provide a constant velocity to the translation stage. The level $L_2$ of the driving signal is maintained until a negative current, shown as level $L_3$ in FIG. 4, is applied to the actuator so as to rapidly decelerate the translation stage 116. Hence, over a translation cycle, the translation stage 116 is accelerated during the period A to B, maintains a steady velocity during the period B to C and is decelerated during the period C to D. The velocity of the translation stage is therefore as shown by plot 204 shown in FIG. 4.

The output signal of the position encoder is shown as encoder signal 206 in FIG. 4 and is in the form of a square wave pulse train. It can be seen from the signal 206 that the frequency of the pulse train is proportional to the velocity of the translation stage. Hence, as the translation stage is accelerated during the period A to B, the encoder signal 206 increases in frequency to reach a steady state pulse repetition frequency which is maintained during the period B to C, when the translation stage is moved at a steady state constant velocity, and reduces in frequency during the deceleration period C to D of the translation stage 116. Hence, each pulse of the encoder signal represents a fixed amount of movement of the translation stage; 0.2 microns in the embodiment described.

The pattern of the printing required from the inkjet head is stored as a sequence of data in the memory area of the data generator 126. The pattern data is represented by data elements $D_1$ to $D_n$ in FIG. 4. Each element corresponds to one period in the encoder signal, and may be programmed to give a high or a low output as shown in the figure. It is possible to program the data elements such that the output from the data generator gives a pulse during any part of the velocity profile of the translation stage. During printing of the device the switch 136 of the data generator is arranged so that the encoder signal from the position encoder 128 is input to function as a clock signal for the pattern memory 130. For each 0.2 microns of movement of the translation stage 116, the position encoder 128 provides an encoder signal in the form of one of the pulses of the pulse train 206 shown in FIG. 4. Element D3 corresponds to the third pulse of the pulse train 206 from the position encoder 128; namely, at the time when the translation stage has moved through 0.6 microns from its initial rest position. This third pulse from the position encoder acts as a clock pulse for the pattern memory 130, which provides an output signal from the data generator 126 via an output circuit 138. Such an output signal provided from the data generator 126 acts as a trigger for the waveform generator. The output signal from the data generator 126 is therefore in the form of a pulse train 208, with the spacing between pulses 210 of the pulse train being determined by the pattern data stored in the pattern memory and the pulses of the encoder signal 206 output from the position encoder 128, which trigger the data generator to output the pulses 210.

The pulses 210 from the data generator are fed to and act as clock or trigger pulses for the waveform generator, which provides a driving pulse 212 to the inkjet print head each time that a pulse 210 is received. It can be seen therefore from the waveform and timing diagrams shown in FIG. 4 that the provision of the driving pulses 212 to the inkjet head, which cause the ejection of the droplets of material to be printed from the head, is synchronised with the speed of the translation stage 116. Hence, irrespective of whether the translation stage is accelerating, decelerating or moving at a constant speed, the droplets of material to be printed are ejected at the correct co-ordinates onto the substrate. This is also the case when a variation in the speed of the translation stage takes place, such as may occur as a result of a periodic variation in the pitch of the lead screw used to physically drive the translation stage 116.

During or between printing of devices by the inkjet apparatus shown in FIG. 3, there may be periods of time when the inkjet head is not used for printing a device and the inkjet head is then positioned at an idling position outside of the device area on the substrate. However, to prevent clogging of the nozzles of the inkjet head during these idling periods it is necessary to periodically eject material from the nozzles of the inkjet head. During such idling periods, the translation stage is stationary and hence an encoder signal from the position encoder 128 is not present to use as a clock pulse for the pattern memory 130. Hence, there is no output signal from the data generator and the waveform generator does not therefore provide the driving pulses to the inkjet print head.

Therefore, upon commencement of an idling period the switch 136 is operated to couple a clock generator 140 to the pattern memory. The clock generator produces a stream of clock pulses which substitute for the encoder signals provided during translation of the translation stage 116. Hence, the pattern generator outputs a stream of trigger pulses to the waveform generator in synchronism with the clock pulses from the clock generator 140. Clogging of the nozzles of the inkjet head during the idling periods is therefore avoided. Such a procedure may also be used for periodic cleaning of the nozzles.

The translation stage 116 can move the substrate in both an X and a Y axis relative to the inkjet head and comprises therefore respective stages with respective lead screws for the X and Y axes.

The system of the present invention can also be used to correct for errors in the displacement of the X and Y stages.

For instance, an over or under shoot of translation length of either stage can be corrected by programming the computer 118 with a correction for the co-ordinates of the device being printed. This error may occur in both axes X and Y, thus the new co-ordinate system is applied to cover the whole area of that device in both axes. Various alignment marks can be observed on a device, and so by programming the stages to move to these co-ordinates, it is possible to observe the error in the position of the stages over relatively large distances across the device. For example, along the X axis say, the stage can be programmed to move from one mark to another, and by rotation of the device it is possible to compensate for an error in the position of the device on the stage. However, the length of travel may be also be determined as being too long or too short along this axis. This error can be compensated for by programming a correction factor into the travel length command for this single axis.

Ideally, the construction angle between the axes X and Y of the translation stage must be exactly 90 degrees. However, in practice, this ideal construction angle is usually not achieved due to manufacturing tolerances. Hence, when the stages are programmed to move to a certain co-ordinate there will be an offset error. The system may also be programmed to compensate for such errors in the construction angle between the two axes.

Figure 5:
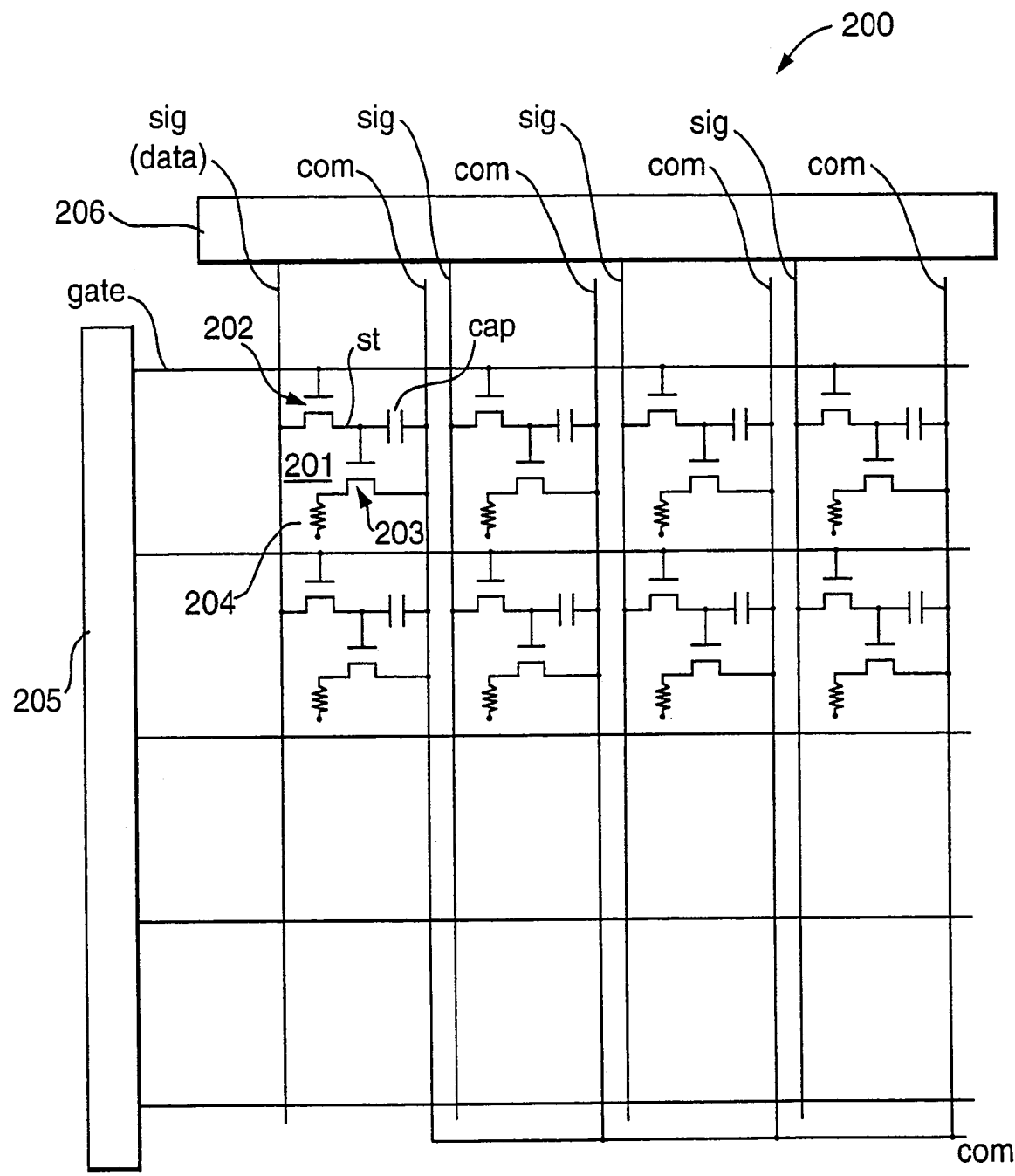
FIG. 5 shows a block diagram of an electrooptic device.

FIG. 5 is a block diagram illustrating an active matrix type display device (or apparatus) incorporating electro-optical elements, such as organic electroluminescent elements as a preferred example of the electro-optical devices, and an addressing scheme which may be fabricated using the method or apparatus of the present invention. In the display device 200 shown in this figure, a plurality of scanning lines "gate", a plurality of data lines "sig" extending in a direction that intersects the direction in which the scanning lines "gate" extend, a plurality of common power supply lines "com" extending substantially parallel to the data lines "sig", and a plurality of pixels 201 located at the intersections of the data lines "sig" and the scanning lines "gate" which are formed above a substrate.

Each pixel 201 comprises a first TFT 202, to which a scanning signal is supplied to the gate electrode through the scanning gate, a holding capacitor "cap" which holds an image signal supplied from the data line "sig" via the first TFT 202, a second TFT 203 in which the image signal held by the holding capacitor "cap" is supplied to the gate electrode (a second gate electrode), and an electro-optical element 204 such as an electroluminescent element (indicated as a resistance) into which the driving current flows from the common power supply line "com" when the element 204 is electrically connected to the common power supply line "com" through the second TFT 203. The scanning lines "gate" are connected to a first driver circuit 205 and the data lines "sig" are connected to a second driver circuit 206. At least one of the first circuit 205 and the second circuit 205 can be preferably formed above the substrate above which the first TFTs 202 and the second TFTs 203 are formed. The TFT array(s) manufactured by the methods according to the present invention can be preferably applied to at least one of an array of the first TFTs 202 and the second TFTs 203, the first driver circuit 205, and the second driver circuit 206.

The present invention may therefore be used to fabricate displays and other devices which are to be incorporated in many types of equipment such as mobile displays e.g. mobile phones, laptop personal computers, DVD players, cameras, field equipment; portable displays such as desktop computers, CCTV or photo albums; instrument panels such as vehicle or aircraft instrument panels; or industrial displays such as control room equipment displays. In other words, an electro-optical device or display to which the TFT array(s) manufactured by the apparatus of the present invention is (are) applied as noted above can be incorporated in the many types of equipment, as exemplified above.

Various electronic apparatuses using electro-optical display devices fabricated by the apparatus of the present invention will now be described.

<1: Mobile Computer>

An example in which the display device fabricated in accordance with one of the above embodiments is applied to a mobile personal computer will now be described.

FIG. 6 is an isometric view illustrating the configuration of this personal computer. In the drawing, the personal computer 1100 is provided with a body 1104 including a keyboard 1102 and a display unit 1106. The display unit 1106 is implemented using a display panel fabricated according to the patterning method of the present invention, as described above.

<2: Portable Phone>

Next, an example in which the display device is applied to a display section of a portable phone will be described. FIG. 7 is an isometric view illustrating the configuration of the portable phone. In the drawing, the portable phone 1200 is provided with a plurality of operation keys 1202, an earpiece 1204, a mouthpiece 1206, and a display panel 100. This display panel 100 is implemented using a display device fabricated in accordance with the method of the present invention, as described above.

<3: Digital Still Camera>

Next, a digital still camera using an OEL display device as a finder will be described. FIG. 8 is an isometric view illustrating the configuration of the digital still camera and the connection to external devices in brief.

Typical cameras use sensitized films having light sensitive coatings and record optical images of objects by causing a chemical change in the light sensitive coatings, whereas the digital still camera 1300 generates imaging signals from the optical image of an object by photoelectric conversion using, for example, a charge coupled device (CCD). The digital still camera 1300 is provided with an OEL element 100 at the back face of a case 1302 to perform display based on the imaging signals from the CCD. Thus, the display panel 100 functions as a finder for displaying the object. A photo acceptance unit 1304 including optical lenses and the CCD is provided at the front side (behind in the drawing) of the case 1302.

When a cameraman determines the object image displayed in the OEL element panel 100 and releases the shutter, the image signals from the CCD are transmitted and stored to memories in a circuit board 1308. In the digital still camera 1300, video signal output terminals 1312 and input/output terminals 1314 for data communication are provided on a side of the case 1302. As shown in the drawing, a television monitor 1430 and a personal computer 1440 are connected to the video signal terminals 1312 and the input/output terminals 1314, respectively, if necessary. The imaging signals stored in the memories of the circuit board 1308 are output to the television monitor 1430 and the personal computer 1440, by a given operation.

Examples of electronic apparatuses, other than the personal computer shown in FIG. 6, the portable phone shown in FIG. 7, and the digital still camera shown in FIG. 8, include OEL element television sets, view-finder-type and monitoring-type video tape recorders, vehicle navigation and instrumentation systems, pagers, electronic notebooks, portable calculators, word processors, workstations, TV telephones, point-of-sales system (POS) terminals, and devices provided with touch panels. Of course, OEL devices fabricated using the apparatus of the present invention can be applied not only to display sections of these electronic apparatuses but also to any other form of apparatus which incorporates a display section.

Furthermore, the display devices fabricated in accordance with the present invention are also suitable for a screen-type large area television which is very thin, flexible and light in weight. It is possible therefore to paste or hang such large area television on a wall. The flexible television can, if required, be conveniently rolled up when it is not used.

Printed circuit boards may also be fabricated using the apparatus of the present invention. Conventional printed circuit boards are fabricated by photolithographic and etching techniques, which increase the manufacturing cost, even though they are a more cost-oriented device than other microelectronics devices, such as IC chips or passive devices. High-resolution patterning is also required to achieve high-density packaging. High-resolution interconnections on a board can be easily and reliably be achieved using the present invention.

Colour filters for colour display applications may also be provided using the present invention. Droplets of liquid containing dye or pigment are deposited accurately onto selected regions of a substrate. A matrix format is frequently used with the droplets in extremely close proximity to each other. In situ viewing can therefore prove to be extremely advantageous. After drying, the dye or pigments in the droplets act as filter layers.

DNA sensor array chips may also be provided using the present invention. Solutions containing different DNAs are deposited onto an array of receiving sites separated by small gaps as provided by the chips.

The aforegoing description has been given by way of example only and it will be appreciated by a person skilled in the art that modifications can be made without departing from the scope of the present invention.

For example, a separate controller, which is responsive to the encoding signals from the encoder, may be provided for controlling the provision of the drive signals from the monitored position of the translation stage. Furthermore, the present invention has been described with reference to inkjet printing machines in general and without reference to any particular type or form of substrate. However, it is apparent from the above description that the present invention can provide particular benefits in the fabrication of devices, as exemplified above, and thus is particularly suited to printing on pre-patterned substrates which can carry pre-patterns in the form, for example, of electrode pre-patterns or one or more pre-patterns of wall structures defined in a material having a de-wetting characteristic for the material to be printed.

The invention claimed is:

1. An inkjet machine comprising:
   a print head for ejecting one or more droplets of a material onto a substrate;
   a translation stage for providing relative movement between the substrate and the print head, the print head being configured to eject a liquid material during an idling period at which the translation stage is stationary;
   a computer supplying a first signal to the print head and a second signal to the translation stage; and
   a data generator receiving a third signal from the translation stage and controlling the print head according to the third signal, the data generator including a clock generator producing a clock pulse that is used for controlling the print head when the translation stage stops supplying the third signal to the data generator.

2. The inkjet machine according to claim 1, further comprising:
   a wave form generator receiving a fourth signal from the data generator and outputting a driving pulse to the print head.

3. The inkjet machine according to claim 1, the translation stage including a position encoder that generates the third signal as an encode signal.

4. The inkjet machine according to claim 1, the translation stage including an actuator that receives the second signal as a driving signal.

5. The inkjet machine according to claim 1, the print head including a nozzle that ejects a liquid material according to the first signal as a nozzle selection signal.

6. The inkjet machine according to claim 1, the data generator further including a switch that selects a terminal of the clock generator when the translation stage stops supplying the third signal to the data generator, the switch selecting a terminal of the translation stage when the translation stage supplies the third signal to the data generator.

7. The inkjet machine according to claim 1, the data generator further including a pattern memory storing a pattern data, the pattern memory transmitting the pattern data according to the clock pulse when the translation stage stops supplying the third signal to the data generator, the pattern memory transmitting the pattern data according to the third signal when the translation stage supplies the third signal to the data generator.

* * * * *